(12) United States Patent
Chiang et al.

(10) Patent No.: US 10,446,604 B2
(45) Date of Patent: Oct. 15, 2019

(54) DISPLAY APPARATUS AND FABRICATING METHOD FOR DISPLAY APPARATUS

(71) Applicant: Innolux Corporation, Miao-Li County (TW)

(72) Inventors: Kuo-Chang Chiang, Miao-Li County (TW); Jui-Feng Ko, Miao-Li County (TW); Tsau-Hua Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/629,766

(22) Filed: Jun. 22, 2017

(65) Prior Publication Data

US 2018/0012930 A1  Jan. 11, 2018

(30) Foreign Application Priority Data

Jul. 5, 2016  (TW) .............................. 105121152 A

(51) Int. Cl.
*H01L 27/15* (2006.01)
*H01L 33/62* (2010.01)
(Continued)

(52) U.S. Cl.
CPC ........ *H01L 27/156* (2013.01); *H01L 25/0753* (2013.01); *H01L 33/0095* (2013.01);
(Continued)

(58) Field of Classification Search
CPC ... H01L 27/156; H01L 33/0095; H01L 33/06; H01L 33/62; H01L 25/0753
(Continued)

(56) References Cited

U.S. PATENT DOCUMENTS

| 6,550,665 B1 * | 4/2003 | Parrish ................. | B23K 35/26 228/180.21 |
| 2012/0161336 A1 * | 6/2012 | Lin ....................... | H01L 23/345 257/782 |

(Continued)

FOREIGN PATENT DOCUMENTS

| CN | 101922627 | 12/2010 |
| CN | 103547085 | 1/2014 |

(Continued)

OTHER PUBLICATIONS

"Office Action of Taiwan Counterpart Application," dated Jan. 13, 2017, p. 1-6.

(Continued)

*Primary Examiner* — Fazli Erdem
(74) *Attorney, Agent, or Firm* — JCIPRNET

(57) ABSTRACT

A display apparatus and a fabricating method for a display apparatus are provided. The fabricating method for the display apparatus includes the following steps. An array substrate having a first electrode and a second electrode is provided. A first light emitting diode is heated to soften a first bump between the first electrode and the first light emitting diode, the first light emitting diode is bonded onto the first electrode by the first bump. The first light emitting diode and a second light emitting diode are heated to soften the first bump and a second bump between the second electrode and the second light emitting diode, the second light emitting diode is bonded onto the second electrode by the second bump, and the first light emitting diode and the second light emitting diode are pressed.

11 Claims, 7 Drawing Sheets

(51) Int. Cl.
  *H01L 25/07* (2006.01)
  *H01L 33/00* (2010.01)
  *H01L 33/06* (2010.01)
  *H01L 25/075* (2006.01)

(52) U.S. Cl.
  CPC .............. *H01L 33/06* (2013.01); *H01L 33/62* (2013.01); *H01L 2933/0066* (2013.01)

(58) Field of Classification Search
  USPC ........................................................ 257/89
  See application file for complete search history.

(56) References Cited

U.S. PATENT DOCUMENTS

| | | | | |
|---|---|---|---|---|
| 2013/0228916 | A1* | 9/2013 | Mawatari | H01L 24/81 257/737 |
| 2014/0124925 | A1* | 5/2014 | Sidhu | B23K 35/0244 257/738 |
| 2014/0159043 | A1* | 6/2014 | Sakariya | H01L 27/124 257/59 |
| 2014/0332762 | A1* | 11/2014 | Kim | H01L 51/5271 257/40 |
| 2015/0061118 | A1* | 3/2015 | Chen | H01L 24/16 257/737 |
| 2015/0061158 | A1* | 3/2015 | Pharand | H01L 24/11 257/779 |
| 2015/0338069 | A1* | 11/2015 | Tamura | F21V 23/06 362/249.04 |
| 2016/0155892 | A1* | 6/2016 | Li | H01L 24/00 257/89 |
| 2017/0069551 | A1* | 3/2017 | Fukayama | H01L 22/12 |
| 2017/0243848 | A1* | 8/2017 | Nah | H01L 24/17 |
| 2017/0278733 | A1* | 9/2017 | Chang | H01L 21/67144 |
| 2017/0345801 | A1* | 11/2017 | Lin | H01L 25/0753 |

FOREIGN PATENT DOCUMENTS

| | | |
|---|---|---|
| CN | 104733643 | 6/2015 |
| CN | 204793617 | 11/2015 |
| CN | 105493297 | 4/2016 |
| CN | 105555013 | 5/2016 |
| JP | 2010014767 | 1/2010 |
| TW | 201417240 | 5/2014 |

OTHER PUBLICATIONS

"Office Action of China Counterpart Application," dated May 7, 2019, p. 1-p. 9.

* cited by examiner

DISPLAY APPARATUS AND FABRICATING METHOD FOR DISPLAY APPARATUS

CROSS-REFERENCE TO RELATED APPLICATION

This application claims the priority benefit of Taiwan application serial no. 105121152, filed on Jul. 5, 2016. The entirety of the above-mentioned patent application is hereby incorporated by reference herein and made a part of this specification.

BACKGROUND

Field

The disclosure relates to an apparatus and a fabricating method for an apparatus, and particularly relates to a display apparatus and a fabricating method for a display apparatus.

Description of Related Art

Since a light emitting diode (LED) display apparatus has advantages of active light emitting, high brightness, high contrast, low power consumption, or has a longer life compared to an organic light emitting diode (OLED) display apparatus, it becomes one of the technologies of new type displays to be developed in recent years. To satisfy the needs of high resolution, the light emitting diode display apparatus has developed toward a direction to be composed of an active element array substrate and micron-sized light emitting diodes arranged in an array.

SUMMARY

The present disclosure provides a fabricating method for a display apparatus including the following steps. An array substrate having a first electrode and a second electrode is provided. A first light emitting diode is heated to soften a first bump between the first electrode and the first light emitting diode such that the first light emitting diode is bonded onto the first electrode by the first bump. The first light emitting diode and a second light emitting diode are heated to soften the first bump and a second bump between the second electrode and the second light emitting diode such that the second light emitting diode is bonded onto the second electrode by the second bump, and the first light emitting diode and the second light emitting diode are pressed.

The present disclosure provides a display apparatus comprising an array substrate, a first light emitting diode, a second light emitting diode, a first bump, and a second bump. The array substrate has a first electrode and a second electrode. The first bump is disposed corresponding to the first electrode and the first light emitting diode and electrically connected to the first electrode and the first light emitting diode. The second bump is disposed corresponding to the second electrode and the second light emitting diode and electrically connected to the second electrode and the second light emitting diode. A number of phases of the first bump is different from a number of phases of the second bump.

In order to make the aforementioned features and advantages of the present disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
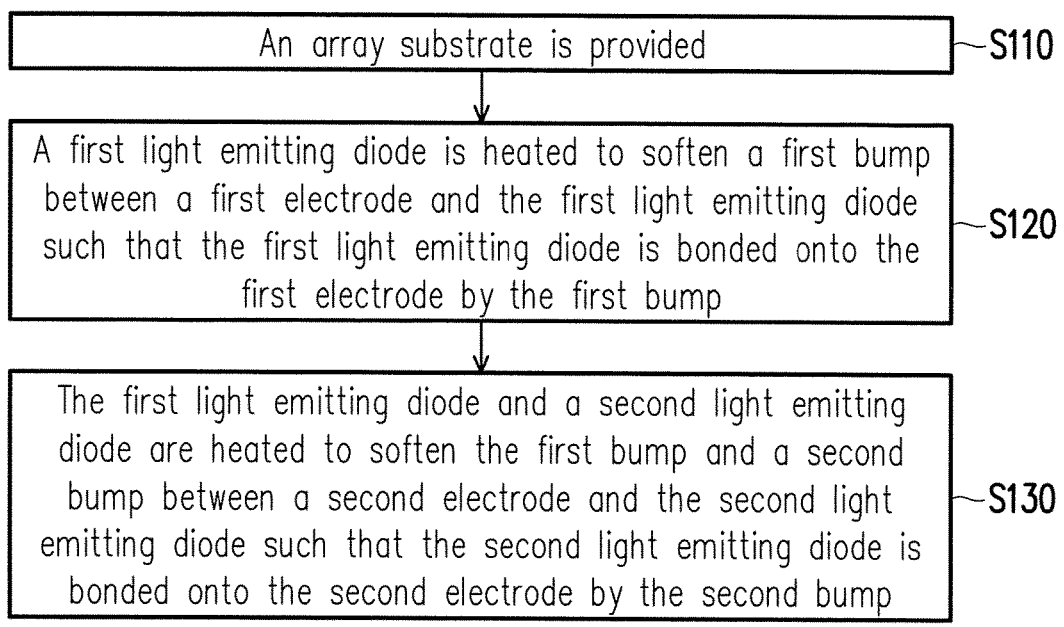
FIG. 1 is a flow chart of a fabricating method for a display apparatus according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
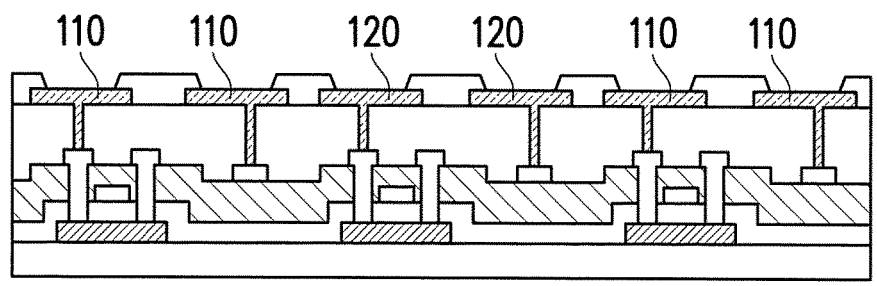
FIG. 2A to FIG. 2D are schematic cross-sectional views of a fabricating method for a display apparatus according to an embodiment of the present disclosure.

FIG. 1 is a flow chart of a fabricating method for a display apparatus according to an embodiment of the present disclosure. FIG. 2A to FIG. 2D are schematic cross-sectional views of a fabricating method for a display apparatus according to an embodiment of the present disclosure. The fabricating method for the display apparatus of the embodiment includes the following steps. Referring to FIG. 1 and FIG. 2A, Step S110, an array substrate 100 is provided first. The array substrate 100 can be an active element substrate. A partial region of a cross section of the array substrate 100 is shown in FIG. 2A. A surface of the array substrate 100 has a first electrode 110 and a second electrode 120 thereon. Numbers of the first electrode 110 and the second electrode 120 are multiple as an example in the embodiment. However, the disclosure is not limited thereto. In other embodiments, the numbers of the first electrode 110 and the second electrode 120 may be one.

Figure 2B:
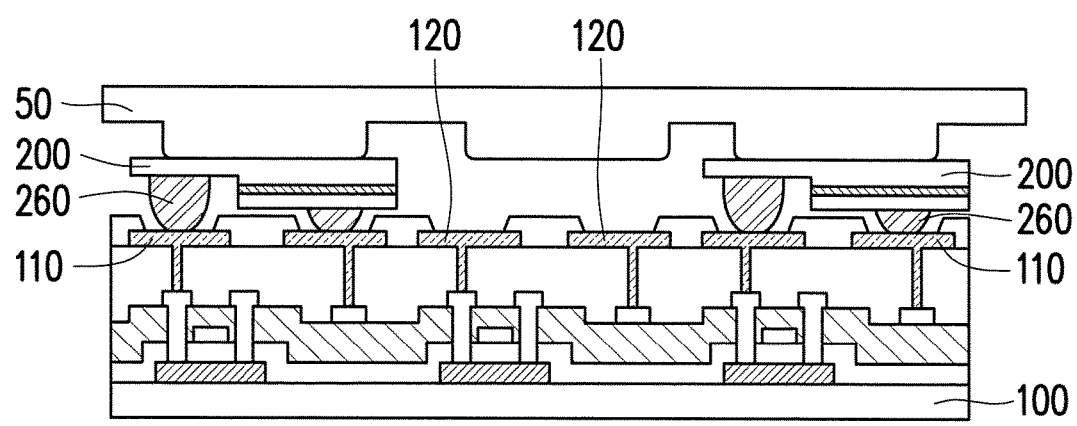

Then, referring to FIG. 1 and FIG. 2B, Step S120, a first light emitting diode 200 is heated to soften a first bump 260 between the first electrode 110 and the first light emitting diode 200, and the first light emitting diode 200 is bonded onto the first electrode 110 by the first bump 260. The step of heating and bonding the first light emitting diode 200 can be subdivided into the following steps, for example. A pick-up head 50 is used to pick up and move the first light emitting diode 200. Next, the alignment of the first light emitting diode 200 and the first electrode 110 corresponding thereto is completed, and then the first light emitting diode 200 is placed on the corresponding first electrode 110. After moving the first light emitting diode 200 and placing the first light emitting diode 200 on the first electrode 110, the first light emitting diode 200 is heated to soften the first bump 260 between the first electrode 110 and the first light emitting diode 200 and the first electrode 110 and the first light emitting diode 200 are bonded by the softened first bump 260. The method of heating the first light emitting diode 200 is heating by using infrared ray, laser, thermal resistance wires, or hot filaments, for example. it may be surfaces of the first bump 260 which are slightly softened, and the purpose is to bond the first bump 260 to the first electrode 110.

Figure 2C:
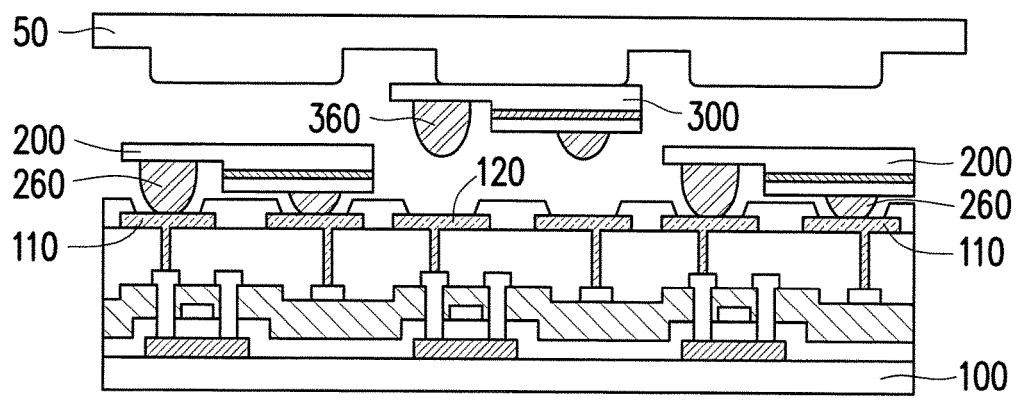
Figure 2D:
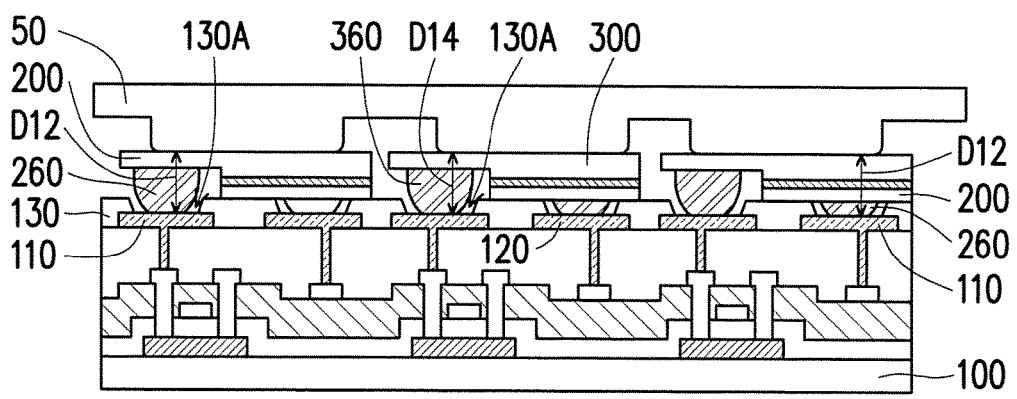

Then, referring to FIG. 1, FIG. 2C, and FIG. 2D, Step S130, the first light emitting diode 200 and a second light emitting diode 300 are heated to soften the first bump 260 and a second bump 360 between the second electrode 120 and the second light emitting diode 300, and the second light emitting diode 300 is bonded onto the second electrode 120 by the second bump 360. Also, the first light emitting diode 200 and the second light emitting diode 300 are pressed. The step of heating the first light emitting diode 200 and the second light emitting diode 300, and bonding the second light emitting diode 300 can be subdivided into the following steps, for example. The second light emitting diode 300 is picked up and moved, and the alignment of the second light emitting diode 300 and the second electrode 120 is completed as shown in FIG. 2C. Next, the second light emitting diode 300 is placed on the second electrode 120. After moving the second light emitting diode 300 and placing the second light emitting diode 300 on the second electrode 120, the first light emitting diode 200 and the second light emitting diode 300 are heated to soften the first bump 260 and the second bump 360 between the second electrode 120 and the second light emitting diode 300 such that the second electrode 120 and the second light emitting diode 300 are bonded by the softened second bump 360. Additionally, in the state that the first bump 260 and the second bump 360 are softened, the first light emitting diode 200 and the second light emitting diode 300 are pressed on the array substrate 100. In this case, a number of times the first bump 260 being softened is more than a number of times the second bump 360 being softened. Additionally, after bonding the second electrode 120 and the second light emitting diode 300, the first bump 260 and the second bump 360 may be further heated to be softened. Then, the first light emitting diode 200 and the second light emitting diode 300 are pressed onto the array substrate 100.

In the fabricating method for the display apparatus of the above embodiment, the light emitting diodes are at least divided into two batches to be bonded onto the array substrate. Thus, the light emitting diodes can be bonded in batches according to different characteristics. Also, the light emitting diodes with different characteristics can be evenly distributed on the array substrate respectively according to the needs, thereby enabling the entire display screen to be uniform. However, in other embodiments, the light emitting diodes may also be bonded onto the array substrate at one time. The disclosure is not limited to the light emitting diodes being bonded onto the array substrate in batches.

In the embodiment, in the step of pressing the first light emitting diode 200 and the second light emitting diode 300 onto the array substrate 100, the first light emitting diode 200 and the second light emitting diode 300 may have the same height selectively. The meaning that the first light emitting diode 200 and the second light emitting diode 300 having the same height is that, a distance D12 and a distance D14 are substantially the same, while the distance D12 is between crystal back of each the first light emitting diode 200 and the surface of the first electrode 110, and the distance D14 is between crystal back of each the second light emitting diode 300 and the surface of the second electrode 120. Since the first light emitting diode 200 and the second light emitting diode 300 have substantially the same height, light emitting field types of the first light emitting diode 200 and the second light emitting diode 300 are substantially the same, thereby ensuring that the display screen of the display apparatus 60 is uniform, and have high-quality display image quality. It should be noted that, the terms of "substantially the same" and "substantially the same height" usually represent that the difference between any of the two is within 20% when comparing several values. Preferably, within 10%, and more preferably, within 5%, within 3%, within 2%, within 1%, or within 0.5%.

In the embodiment, a temperature of heating the first light emitting diode 200 and the second light emitting diode 300 in one step is higher than a temperature of heating the first light emitting diode 200 in another step. To have a larger operating space when pressing the first light emitting diode 200 and the second light emitting diode 300, they must be heated to a higher temperature such that the softening degrees of the first bump 260 and the second bump 360 are larger. To achieve higher resolution, dimensions of the first light emitting diode 200 and the second light emitting diode 300 of the embodiment are micron order, for example, 10 microns to 1000 microns. The pick-up head 50 of the embodiment utilizes vacuum suction force, electrostatic attraction, or other methods to complete the step of picking up and moving the first light emitting diode 200 and the second light emitting diode 300, for example.

Figure 3A:
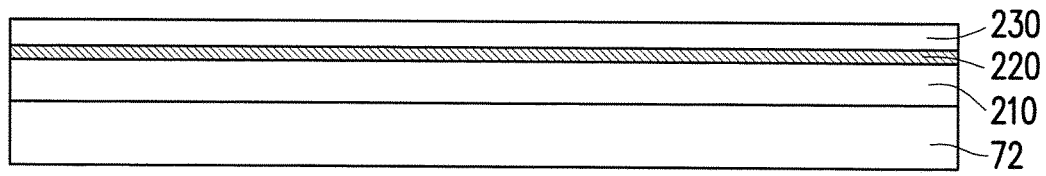
FIG. 3A to FIG. 3D are schematic cross-sectional views of a fabricating method for a light emitting diode.
Figure 3B:
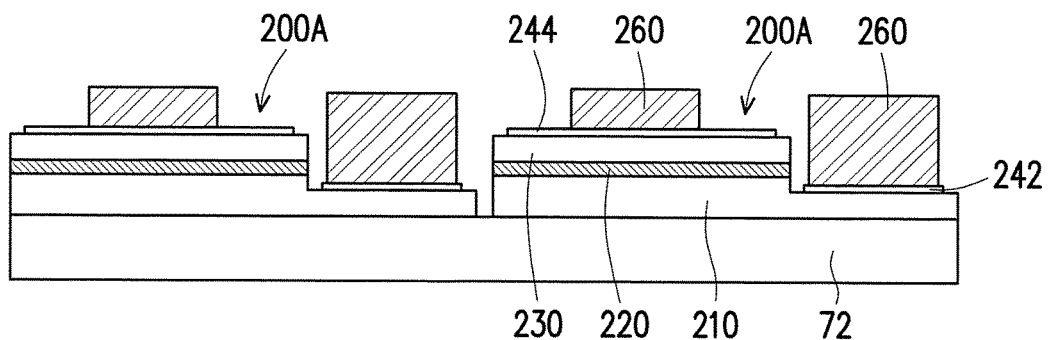

FIG. 3A to FIG. 3D are schematic cross-sectional views of a fabricating method for a light emitting diode. The first light emitting diode is served as an example, and the fabricating method thereof includes the following steps, for example. Referring to FIG. 3A, a first type doped semiconductor layer 210, a quantum well layer 220, and a second type doped semiconductor layer 230 are fully formed on an epitaxial substrate 72 sequentially. Next, referring to FIG. 3B, the first type doped semiconductor layer 210, the quantum well layer 220, and the second type doped semiconductor layer 230 are patterned to form a plurality of light emitting diode units 200A. The embodiment is to form the plurality of light emitting diode units 200A at one time as an example. However, it may be forming one light emitting diode unit 200A at one time. The step of patterning is to cut the first type doped semiconductor layer 210, the quantum well layer 220, and the second type doped semiconductor layer 230, which are stacked, into the plurality of light emitting diode units 200A separated from each other by laser, and each of the light emitting diode units 220A respectively includes the first type doped semiconductor layer 210, the quantum well layer 220, and the second type doped semiconductor layer 230. Additionally, the second type doped semiconductor layer 230 and the quantum well layer 220 of each the light emitting diode unit 220A are partially removed to expose a part of the first type doped semiconductor layer 210 of each the light emitting diode unit 220A. In other words, a part of the first type doped semiconductor layer 210 is not covered by the second type doped semiconductor layer 230 and the quantum well layer 220. Next, a first pad 242 and a second pad 244 are formed on each the light emitting diode unit 200A respectively. The first pad 242 is in contact with the first type doped semiconductor layer 210, and the second pad 244 is in contact with the second type doped semiconductor layer 230. Then, the first bump 260 is formed on each the first pad 242 and each the second pad 244 respectively. The first bump 260 is known as a bump, for example. In the embodiment, the first pad 242 and the second pad 244 may be an anode and a cathode, or a cathode and an anode of the light emitting diode unit 200A respectively.

Figure 3C:
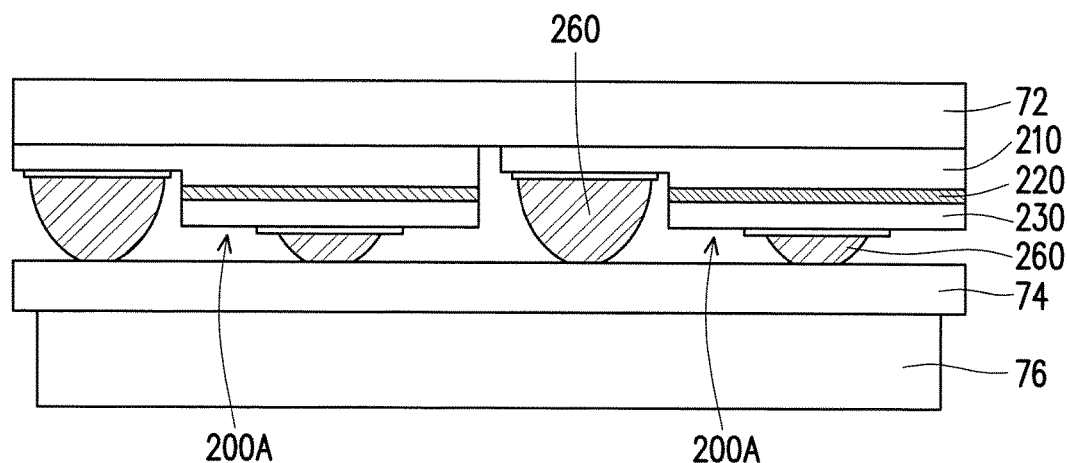
Figure 3D:
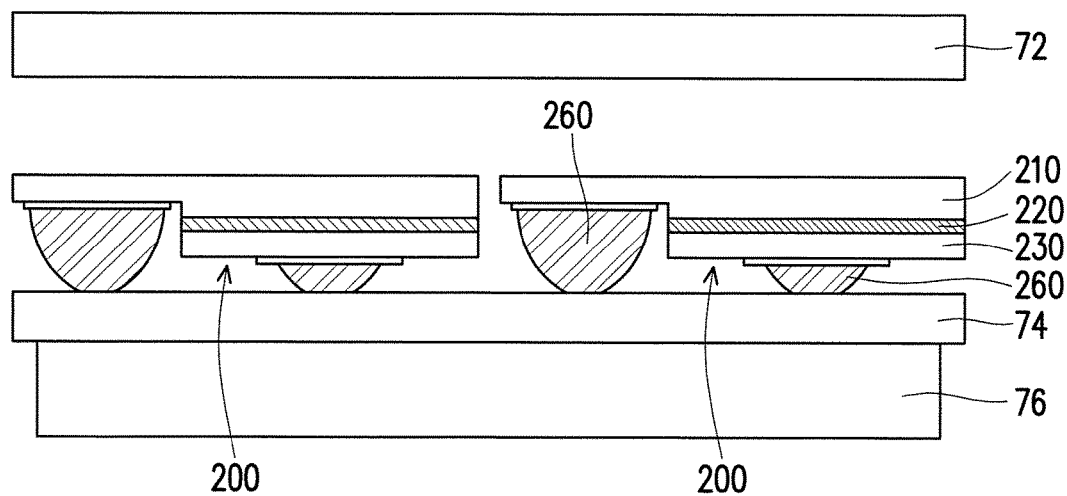

Then, referring to FIG. 3C, the epitaxial substrate 72 is flipped, and the epitaxial substrate 72 and the light emitting diode unit 200A are bonded onto a temporary substrate 74. The first bump 260 is in contact with the temporary substrate 74 and located between the epitaxial substrate 72 and the temporary substrate 74. A heater 76 may be below the temporary substrate 74, for example, to heat and soften the first bump 260 through the temporary substrate 74, and the first bump 260 is adhered onto the temporary substrate 74. Then, referring to FIG. 3D, the epitaxial substrate 72 and the light emitting diode unit 200A (marked in FIG. 3C) are separated to leave the first light emitting diode 200 formed from the light emitting diode unit 200A on the temporary substrate 74. The method of separating the epitaxial substrate 72 and the light emitting diode unit 200A may be laser. Thereafter, when the first light emitting diode 200 is picked up, the first bump 260 may also be heated and softened by the heater 76, and the first light emitting diode 200 may be picked up. Additionally, before the first light emitting diode 200 is picked up, the first light emitting diode 200 may be detected for facilitating active pickup. That is, the first light emitting diode 200 is picked up according to quality level.

Referring to FIG. 2D, the display apparatus 60 of an embodiment of the present disclosure includes the array substrate 100, the first light emitting diode 200, the second light emitting diode 300, the first bump 260, and the second bump 360. The surface of the array substrate 100 has the first electrode 110 and the second electrode 120. The first bump 260 corresponds to the first electrode 110 and the first light emitting diode 200, and the first bump 260 is electrically connected to the first electrode 110 and the first light emitting diode 200. The second bump 360 corresponds to the second electrode 120 and the second light emitting diode 300, and the first bump 260 is electrically connected to the second electrode 120 and the second light emitting diode 300.

In the display apparatus of the embodiment, a number of phases of the first bump 260 is different from a number of phases of the second bump 360 because the first light emitting diode 200 and the second light emitting diode 300 are bonded onto the array substrate successively. A number of heating the first bump 260 is more than a number of heating the second bump 360. In other words, in the display apparatus of the embodiment, the light emitting diodes can be bonded in batches according to different characteristics, and the light emitting diodes with different characteristics can be evenly distributed on the array substrate respectively according to the needs, thereby enabling the entire display screen to be uniform. It should be noted that, in the text, the phase does not represent a crystalline phase, and it refers to that a material exists in a uniform state. In other embodiments, the light emitting diodes may also be bonded onto the array substrate at one time. The disclosure is not limited to the light emitting diodes being bonded onto the array substrate in batches.

In the embodiment, the first light emitting diode 200 and the second light emitting diode 300 have substantially the same height compared to the array substrate. Thus, the light emitting field types of the first light emitting diode 200 and the second light emitting diode 300 are substantially the same, thereby ensuring that the display screen of the display apparatus 60 is uniform so as to have high-quality display image quality.

Particularly, the number of the light emitting diodes used on the display apparatus 60 may be millions or more, and the light emitting diodes are arranged in an array on the array substrate. It is difficult to bond all of the light emitting diodes to the array substrate 100 smoothly at the same time in once bonding process. Thus, when considering the possibility of mass production, the light emitting diodes may be required to be bonded in batches according to the positions, luminous band, luminous efficiency, or other different characteristics. Since the first light emitting diode 200 and the second light emitting diode 300 are bonded successively, the numbers of cycles of heating and cooling of the first bump 260 and the second bump 360 are different. At each time of heating and cooling cycles, different phases are formed at the bump, and an interface is formed between the different phases. Therefore, the number of the phases of the first bump 260 is different from the number of the phases of the second bump 360. The number of the interfaces of the first bump 260 is different from the number of the interfaces of the second bump 360. For example, the number of the phases of the first bump 260 of FIG. 4A, which is four, is different from the number of the phases of the second bump 360 of FIG. 4B, which is three. Additionally, the cross-sectional shape of the first bump 260 of FIG. 4A may be different from the cross-sectional shape of the second bump 360 of FIG. 4B, wherein the degree of distortion of the first bump 260 is larger because the first bump 260 passed through more cycles of heating and cooling. The number of the interfaces of the first bump 260 is greater than the number of the interfaces from of the second bump 360.

Figure 4A:
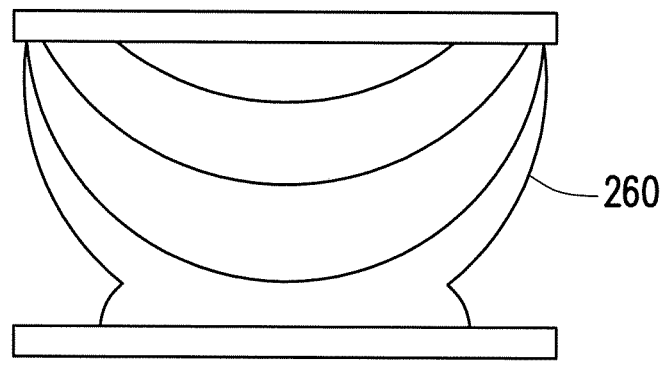
FIG. 4A and FIG. 4B are schematic cross-sectional views of a first bump and a second bump of the display apparatus of FIG. 2D.
Figure 4B:
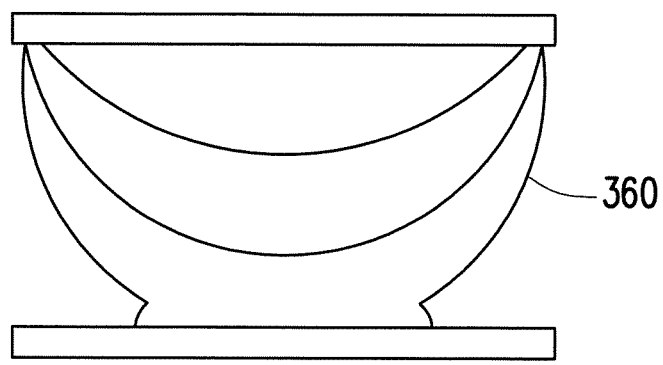

When using different temperature or duration during bonding process, and the content ratio of the phase formed on the bump is also different. For instance, the first bump 260 and the second bump 360 have multiple phases with different content ratios. For example, the content ratio of the two phases of $Cu_6Sn_5$ and $Cu_3Sn$ of the first bump 260, which has longer heating time, is 6:1, and the content ratio of the two phases of $Cu_6Sn_5$ and $Cu_3Sn$ of the second bump 360, which has shorter heating time, is 3:1, wherein $Cu_6Sn_5$ and $Cu_3Sn$ are multiple phases of a copper-tin alloy. At the same time, since the contents of the two phases are different, the thickness ratios of the two phases in the different bumps may have different thickness ratios. Alternatively, the type of alloy of the phase formed on the bump may also be different. For instance, the first bump 260 has two phases composed of two alloys of $Cu_xSn_y$ and $Cu_xNi_z$, and the second bump 360 has two phases composed of two alloys of $Cu_xSn_y$ and $Cu_xSn_yNi_z$. That is, the two phases in the different bumps are composed of different alloys, such as a binary, ternary or multi-element alloy composed of metal of copper, silver, gold, nickel, titanium, tin, or indium. Alternatively, different numbers of voids are formed on the different bumps. For example, the number of the voids observed on a section of the first bump 260 is different from the number of the voids observed on a section of the second bump 360. It should be noted that, in the two different bumps, some of the number of phases, the thickness ratio, the type of alloy, and the content ratio may be the same, and the other may be different. For example, the numbers of the phases are the same, and the types of alloy of the phases are different. Alternatively, the types of alloy of the phases are the same, and the numbers of the phases are different. In other embodiments, since different bumps have different numbers of the phases, thickness ratios, types of alloy, or content ratios, the cross-sectional profiles of the bumps have different topologies, as shown in FIG. 4A and FIG. 4B, for example.

Referring to FIG. 2D, before bonding the first light emitting diode 200 and the second light emitting diode 300, a confinement layer 130 may be formed on the surface of the array substrate 100. The confinement layer 130 has a plurality of openings 130A. The first electrode 110 or the second electrode 120 corresponding to each the opening 130A is exposed. By the confinement layer 130, the risk that the first bump 260 and the second bump 360 being in contact with each other can be reduced. Additionally, the design of the first light emitting diode 200 and the second light emitting diode 300 of the embodiment is based on that the two electrodes are located at the same side as an example. However, the light emitting diode that the two electrodes are located at different sides may also be applied to the display apparatus of the present disclosure. Additionally, in the embodiment, the two electrodes 110 corresponding to the first light emitting diode 200 are electrically connected to the anode and the cathode of the first light emitting diode 200 respectively, and the two electrodes 120 corresponding to the second light emitting diode 300 are electrically connected to the anode and the cathode of the second light emitting diode 300 respectively.

Figure 5A:
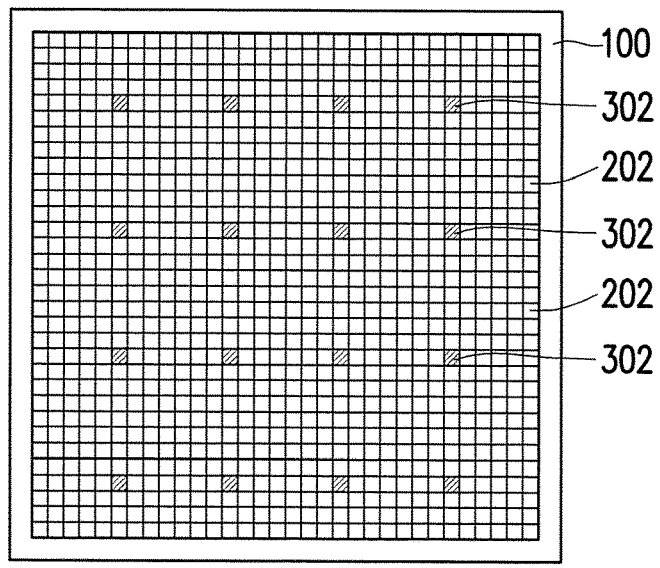
FIG. 5A and FIG. 5B are schematic top views of display apparatuses according to other two embodiments of the present disclosure.
Figure 5B:
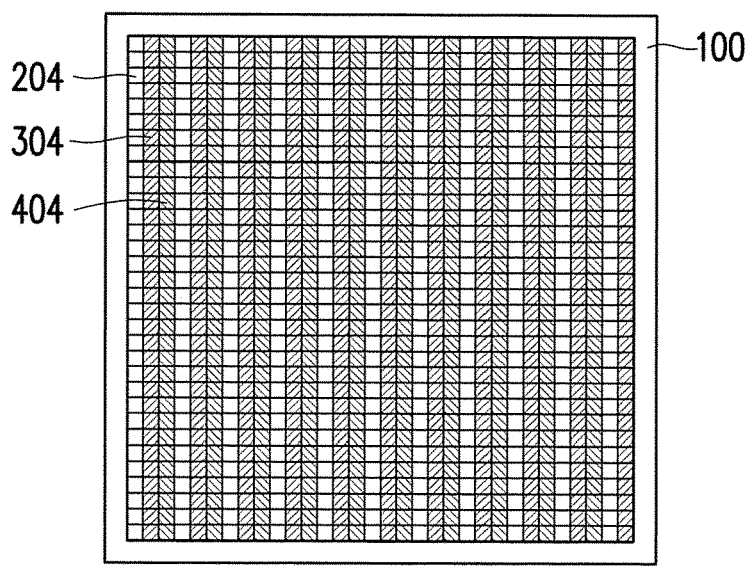

FIG. 5A and FIG. 5B are schematic top views of display apparatuses according to other two embodiments of the present disclosure. Referring to FIG. 5A, numbers of second light emitting diodes 302 and the second electrode (not shown) corresponding thereto and being covered of the embodiment are multiple. The second light emitting diodes 302 are regularly distributed on the surface of the array substrate 100. In other words, the first light emitting diodes 202 are also regularly distributed on the surface of the array substrate 100. The luminous efficiency of the first light emitting diode 202 is different from the luminous efficiency of the second light emitting diode 302 of the embodiment. For example, the luminous efficiency of the first light emitting diode 202 is higher than the luminous efficiency of the second light emitting diode 302. After the light emitting diodes manufactured in batches are tested, they can be divided into the first light emitting diodes 202 and the second light emitting diodes 302 according to the luminous efficiency thereof. By using active pickup, the second light emitting diodes 302 with lower luminous efficiency are regularly distributed on the surface of the array substrate 100, so as to reduce the effect of the second light emitting diodes 302 with lower luminous efficiency on the display screen, thereby increasing productivity without discarding the second light emitting diodes 302.

Referring to FIG. 5B, the difference between the embodiment and the embodiment of FIG. 5A is that, luminous band of second light emitting diodes 304 is different from luminous band of first light emitting diodes 204. Also, the embodiment further includes third light emitting diodes 404 with another luminous band. The first light emitting diodes 204, the second light emitting diodes 304, and the third light emitting diodes 404 having different luminous bands are bonded onto the array substrate 100 in different bonding steps sequentially, but the first light emitting diodes 204, the second light emitting diodes 304, and the third light emitting diodes 404 still maintain the characteristics of substantially the same height. Thus, the light emitting field types of all the first light emitting diodes 204, the second light emitting diodes 304, and the third light emitting diodes 404 may be substantially the same, thereby ensuring that the display screen is uniform.

In summary, in the manufacturing method for the display apparatus and the display apparatus of the present disclosure, the light emitting diodes are actively bonded onto the array substrate. Thus, the bonding position can be arranged according to the characteristic differences of the light emitting diodes such that the entire display screen of the display apparatus can be maintained to be uniform. Additionally, by active pickup and rearranging the light emitting diodes, the light emitting diodes with poor quality can be selected and eliminated or evenly distributed, thereby improving the overall productivity.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A display apparatus, comprising:
an array substrate, having a first electrode and a second electrode;
a first light emitting diode;
a second light emitting diode;
a first bump, disposed corresponding to the first electrode and the first light emitting diode, and electrically connected to the first electrode and the first light emitting diode, wherein the first bump comprises a phase of a first alloy and a phase of a second alloy, and the phase of the first alloy and the phase of the second alloy respectively comprise different metal elements; and
a second bump, disposed corresponding to the second electrode and the second light emitting diode, and electrically connected to the second electrode and the second light emitting diode, wherein a number of phases of the first bump is different from a number of phases of the second bump, the second bump comprises a phase of a third alloy and a phase of a fourth alloy, and the phase of the third alloy and the phase of the fourth alloy respectively comprise different metal elements,
wherein a number of times the first bump heated to soften is more than a number of times the second bump heated to soften,
wherein a degree of distortion of the first bump is larger than a degree of distortion of the second pump.

2. The display apparatus according to claim 1, wherein the first light emitting diode and the second light emitting diode have substantially the same height compared to the array substrate.

3. The display apparatus according to claim 1, wherein dimensions of the first light emitting diode and the second light emitting diode are micron order.

4. The display apparatus according to claim 1, wherein dimensions of the first light emitting diode and the second light emitting diode are 10 micron to 1000 micron.

5. The display apparatus according to claim 1, wherein a number of voids of the first bump is different from a number of voids of the second bump.

6. The display apparatus according to claim 1, wherein the array substrate further has a confinement layer, the confinement layer having a plurality of openings, each of the plurality of opening is corresponding to the first electrode or the second electrode.

7. The display apparatus according to claim 1, wherein numbers of the first electrode, the second electrode, the first light emitting diode, and the second light emitting diode are multiple, and the first light emitting diodes and the second light emitting diodes are arranged in an array on the array substrate.

8. The display apparatus according to claim 7, wherein luminous band of one of the second light emitting diodes is different from luminous band of one of the first light emitting diodes, or luminous efficiency of one of the second light emitting diodes is different from luminous efficiency of one of the first light emitting diodes.

9. The display apparatus according to claim 1, wherein the first light emitting diode comprises:
   a first type doped semiconductor layer;
   a second type doped semiconductor layer; and
   a quantum well layer, disposed between the first type doped semiconductor layer and the second type doped semiconductor layer.

10. The display apparatus according to claim 1, wherein a cross-sectional shape of the first bump is different from a cross-sectional shape of the second bump.

11. A display apparatus, comprising:
   an array substrate, having a first electrode and a second electrode;
   a first light emitting diode;
   a second light emitting diode;
   a first bump, disposed corresponding to the first electrode and the first light emitting diode, and electrically connected to the first electrode and the first light emitting diode, wherein the first bump comprises a first phase and a second phase of a first alloy, and the first phase and the second phase respectively comprise the same metal elements with different composition ratios; and
   a second bump, disposed corresponding to the second electrode and the second light emitting diode, and electrically connected to the second electrode and the second light emitting diode, wherein a number of phases of the first bump is different from a number of phases of the second bump, the second bump comprises a third phase and a fourth phase of a second alloy, and the third phase and the fourth phase of the second alloy comprise the same metal elements with different composition ratios,
   wherein a number of times the first bump heated to soften is more than a number of times the second bump heated to soften,
   wherein a degree of distortion of the first bump is larger than a degree of distortion of the second pump.

* * * * *